United States Patent
Fan et al.

(10) Patent No.: US 11,945,016 B2
(45) Date of Patent: Apr. 2, 2024

(54) APPARATUS AND METHOD FOR FABRICATING FLEXIBLE DISPLAY SCREEN

(71) Applicants: MIANYANG BOE OPTOELECTRONICS TECHNOLOGY CO., Ltd., Sichuan (CN); BOE Technology Group Co., Ltd., Beijing (CN)

(72) Inventors: Rongkun Fan, Beijing (CN); Yuanhong Wen, Beijing (CN); Peng Wang, Beijing (CN); Jialin Wang, Beijing (CN); Zhao Liang, Beijing (CN); Tao Zhang, Beijing (CN); Mu Zeng, Beijing (CN); Yang Wang, Beijing (CN); Jia Deng, Beijing (CN); Hongwei Cui, Beijing (CN)

(73) Assignees: MIANYANG BOE OPTOELECTRONICS TECHNOLOGY CO., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 100 days.

(21) Appl. No.: 17/770,271

(22) PCT Filed: Mar. 9, 2021

(86) PCT No.: PCT/CN2021/079822
§ 371 (c)(1),
(2) Date: Apr. 19, 2022

(87) PCT Pub. No.: WO2021/218408
PCT Pub. Date: Nov. 4, 2021

(65) Prior Publication Data
US 2022/0379357 A1    Dec. 1, 2022

(30) Foreign Application Priority Data
Apr. 28, 2020 (CN) .......................... 202010349802.9

(51) Int. Cl.
*B21B 13/08* (2006.01)
*H05K 5/00* (2006.01)

(52) U.S. Cl.
CPC ............ *B21B 13/08* (2013.01); *H05K 5/0018* (2022.08)

(58) Field of Classification Search
CPC .................. B21B 13/08; H05K 5/0018; B29L 2031/3475; B29C 63/0073;
(Continued)

(56) References Cited

U.S. PATENT DOCUMENTS

| 11,745,489 B2 * | 9/2023 | Liu ........................ H10K 59/00 361/679.02 |
| 2012/0020056 A1 * | 1/2012 | Yamagata ................. G09F 9/33 361/679.01 |

(Continued)

FOREIGN PATENT DOCUMENTS

| CN | 103247233 A | 8/2013 | |
| CN | 106960634 A * | 7/2017 | ............... B32B 3/28 |

(Continued)

OTHER PUBLICATIONS

Pu et al.; CN108630104A; Curved component attaching device; Oct. 9, 2018; pp. 1-8; EPO English Machine Translation (Year: 2018).*

(Continued)

*Primary Examiner* — Bayan Salone
(74) *Attorney, Agent, or Firm* — IPro, PLLC

(57) ABSTRACT

Provided is an apparatus for fabricating a flexible display screen. The apparatus for the flexible display screen includes a roller mechanism and a jig, wherein the jig includes a bearing surface configured to bear a flexible display panel, the bearing surface being a curved surface; and the roller mechanism includes a roller, an axis of the roller being (Continued)

parallel to an element line of the bearing surface, and the roller being configured to roll on the bearing surface along a directrix of the bearing surface.

18 Claims, 11 Drawing Sheets

(58) Field of Classification Search
CPC ....... B29C 2063/027; B29C 2063/0008; G09F 9/301; H10K 77/111; H10K 2102/311
See application file for complete search history.

(56) References Cited

U.S. PATENT DOCUMENTS

| | | | | |
|---|---|---|---|---|
| 2015/0192961 | A1* | 7/2015 | Zhou | G06F 1/1652 156/60 |
| 2017/0199547 | A1* | 7/2017 | Jeong | B32B 37/12 |
| 2020/0047475 | A1* | 2/2020 | Gao | B32B 37/06 |
| 2021/0206154 | A1 | 7/2021 | Liu et al. | |

FOREIGN PATENT DOCUMENTS

| | | | | | |
|---|---|---|---|---|---|
| CN | 106960634 | A | | 7/2017 | |
| CN | 107274791 | A | | 10/2017 | |
| CN | 107505983 | A | | 12/2017 | |
| CN | 206703576 | U | | 12/2017 | |
| CN | 108630104 | A | | 10/2018 | |
| CN | 108630104 | A | * | 10/2018 | ............... G09F 9/00 |
| CN | 108877545 | A | | 11/2018 | |
| CN | 109152236 | A | * | 1/2019 | ............ H05K 3/281 |
| CN | 109152236 | A | | 1/2019 | |
| CN | 109950184 | A | | 6/2019 | |
| CN | 110148358 | A | | 8/2019 | |
| CN | 209401249 | U | | 9/2019 | |
| CN | 209418054 | U | | 9/2019 | |
| CN | 110595739 | A | | 12/2019 | |
| CN | 110722820 | A | | 1/2020 | |
| EP | 1254476 | A1 | * | 11/2002 | ........... C03C 17/002 |
| EP | 1254476 | B1 | | 3/2004 | |
| JP | 2001191345 | A | | 7/2001 | |
| TW | I667640 | B | | 8/2019 | |
| WO | 2010125976 | A1 | | 11/2010 | |
| WO | 2019227670 | A1 | | 12/2019 | |
| WO | WO-2019227670 | A1 | * | 12/2019 | ............. B32B 17/06 |

OTHER PUBLICATIONS

Li et al.; CN 109152236 A; A covering film attaching device for the production of flexible circuit boards; Jan. 4, 2019; EPO English Machine; pp. 1-7Translation (Year: 2019).*
Zheng et al.; CN106960634; Jul. 18, 2017; A Display apparatus and method for manufacturing the same; pp. 1-16; EPO English Machine translation. (Year: 2017).*
CN202010349802.9 first office action.
CN202010349802.9 Notification to grant patent right for invention.

* cited by examiner

APPARATUS AND METHOD FOR FABRICATING FLEXIBLE DISPLAY SCREEN

CROSS-REFERENCE TO RELATED APPLICATION

This application is a US national stage of international application No. PCT/CN2021/079822 filed on Mar. 9, 2021, which claims priority to Chinese Patent Application No. 202010349802.9, filed on Apr. 28, 2020 and entitled "APPARATUS AND METHOD FOR FABRICATING FLEXIBLE DISPLAY SCREEN," the disclosures of which are herein incorporated by reference in their entireties.

TECHNICAL FIELD

The present disclosure relates to the field of display devices, and in particular, relates to an apparatus and method for fabricating a flexible display screen.

BACKGROUND

A flexible display screen refers to a bendable and deformable display screen. Compared with a traditional display screen, the flexible display screen is bendable or foldable, and has many advantages such as impact resistance, strong shock resistance, light weight, and portability. Therefore, the flexible display screen has been more and more widely used.

Generally, the flexible display screen includes a flexible display structure with a curvature. The flexible display structure includes a flexible display panel and a support layer. During fabrication of the flexible display screen, the support layer needs to be attached onto the flexible display screen. In the case of attaching the support layer in the related art, the flexible display panel is laid flat on a plane, and then, the support layer is placed onto the flexible display panel; and a roller is rolled on the support layer to attach the support layer to the flexible display panel, so as to form the flexible display structure, which is then bent to a curvature.

SUMMARY

Embodiments of the present disclosure provide an apparatus and method for fabricating a flexible display screen. The technical solutions are as follows.

According to one aspect, the embodiments of the present disclosure provide an apparatus for fabricating a flexible display screen. The apparatus includes a roller mechanism and a jig, wherein the jig includes a bearing surface configured to bear a flexible display panel; the bearing surface being a curved surface; and the roller mechanism includes a roller, an axis x of the roller being parallel to an element line y of the bearing surface, and the roller being configured to roll on the bearing surface along a directrix z of the bearing surface.

Optionally, an orthographic projection of the bearing surface on a plane perpendicular to the axis of the roller is a curve, wherein the curve is an arc curve; or, the curve includes a circular arc segment, a first linear segment, and a second linear segment, one end of the first linear segment being connected to and tangential to one end of the circular arc segment, and one end of the second linear segment being connected to and tangential to the other end of the circular arc segment.

Optionally, angles corresponding to the arc curve and the circular arc segment are not greater than 180°.

Optionally, the bearing surface includes a flexible-circuit-board positioning groove; wherein the flexible-circuit-board positioning groove is disposed on an end of the bearing surface along a direction of the directrix.

Optionally, the flexible display panel includes a panel body and a flexible circuit board; and the jig includes a vacuum adsorption structure; wherein the vacuum adsorption structure includes a plurality of panel adsorption holes and a plurality of flexible-circuit-board adsorption holes.

Optionally, the roller mechanism further includes a mounting frame and a pressing rod; wherein the mounting frame is disposed above the jig, the pressing rod is disposed on the mounting frame, and the roller is rotatably disposed on an end of the pressing rod.

Optionally, the roller mechanism includes two rollers, and the roller mechanism further includes a mounting frame and two support rods; wherein the mounting frame is disposed above the jig, one end of each of the two support rods is articulated on the mounting frame, and the other end of each of the two support rods is disposed with one rotatable roller; and articulated axes of the two support rods and the axes of the two rollers are parallel to each other.

Optionally, the two support rods are connected by an elastic restoring member, wherein the elastic restoring member is configured to supply a force to cause the two support rods to move towards each other.

Optionally, the roller mechanism further includes an adsorption plate, wherein the adsorption plate is disposed above the jig, the adsorption plate includes a roller clearance hole and a plurality of vacuum adsorption holes, the roller clearance hole being strip-shaped, and the plurality of the vacuum adsorption holes being disposed on two sides of the roller clearance hole.

Optionally, the bearing surface is a curved surface; and the roller mechanism further includes a pair of connection arms, wherein one end of each of the pair of connection arms is articulated with the jig, articulated axes of the pair of connection arms are parallel to the element line of the bearing surface, and the roller is rotatably disposed between the pair of connection arms.

Optionally, the roller is disposed on the connection arms in such a fashion that the roller is movable along length directions of the connection arm; and the connection arms possesses a compression mechanism, wherein the compression mechanism is configured to supply a force to cause the roller to move towards the bearing surface.

Optionally, the connection arm includes an insertion hole and an axial through hole extending along the length direction of the connection arm; wherein the insertion hole is disposed on a side wall of the connection arm and is connected to the axial through hole; one end of the roller is inserted into the insertion hole, and the compression mechanism includes a spring and an adjusting bolt, wherein one end of the adjusting bolt is disposed in the axial through hole, the spring is coaxially disposed in the axial through hole, and two ends of the spring are in contact with the adjusting bolt and the roller respectively.

Optionally, the apparatus further includes a flattening jig, wherein the flattening jig includes a carrier, a first positioning stopper, and a second positioning stopper; wherein the carrier includes a flexible-display-panel drop zone and a positioning-stopper drop zone disposed on a side of the flexible-display-panel drop zone;

both the first positioning stopper and the second positioning stopper are rotatably connected to the carrier; and the first positioning stopper is configured to provide a positioning surface configured to position the flexible display panel in the case that the first positioning stopper is disposed in the positioning-stopper drop zone, and an orthographic projection of the positioning surface on the positioning-stopper drop zone covers a first boundary; and the second positioning stopper is configured such that, in the case that the second positioning stopper is disposed in the positioning-stopper drop zone, an orthographic projection of a surface, proximal to the flexible-display-panel drop zone, of the second positioning stopper on the positioning-stopper drop zone covers a second boundary, wherein the second boundary is spaced apart from the first boundary, and the first boundary is disposed between the second boundary and the flexible-display-panel drop zone.

Optionally, the apparatus further includes a panel bracket, wherein the panel bracket includes a horizontal support surface and a curved support surface; wherein a curved surface where the curved support surface is disposed is tangential to the horizontal support surface; and the horizontal support surface includes a stop protrusion.

According to another aspect, the embodiments of the present disclosure further provide a method for fabricating a flexible display screen applicable to the apparatus as described above. The method includes:

attaching the flexible display panel to the hearing surface of the jig; and placing a support layer between the roller and the bearing surface, and rolling the roller along the bearing surface to attach the support layer to the flexible display panel.

Optionally, rolling the roller along the bearing surface includes:

attaching a middle of the support layer to the flexible display panel;

rolling the roller along a first direction relative to the jig, and attaching a part of one end of the support layer to the flexible display panel;

rolling the roller along a second direction relative to the jig, and attaching the other end of the support layer to the flexible display panel, wherein the second direction is opposite to the first direction; and moving the roller along the first direction relative to the jig, and attaching the whole support layer to the flexible display panel.

BRIEF DESCRIPTION OF THE DRAWINGS

For clearer descriptions of the technical solutions in the embodiments of the present disclosure, the following briefly introduces the accompanying drawings required in the descriptions of the embodiments. Obviously, the accompanying drawings in the following description show merely some embodiments of the present disclosure, and persons of ordinary skills in the art may still derive other drawings from these accompanying drawings without creative efforts.

DETAILED DESCRIPTION

For clearer descriptions of the object, technical solutions and advantages of the present disclosure, the embodiments of the present disclosure are described in detail hereinafter with reference to the accompanying drawings.

Figure 1:
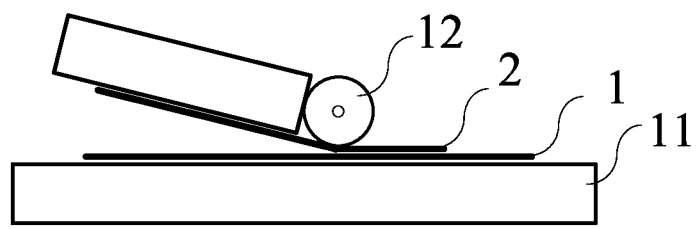
FIG. 1 is a schematic structural diagram of an apparatus for fabricating a flexible display screen in the related art.

FIG. 1 is a schematic structural diagram of an apparatus for fabricating a flexible display screen in the related art. As shown in FIG. 1, the apparatus includes a flat plate 11 and a roller 12. In the case of fabricating the flexible display screen, a flexible display panel 1 is laid flat on the flat plate 11, a support layer 2 is placed on the flexible display panel, and the roller 12 is rolled on the support layer 2 to attach the support layer 2 and the flexible display panel 1 into a whole. The support layer 2 is generally made of stainless steel.

After being fabricated, the flexible display screen needs to undergo a bending test, during which the flexible display screen would be repeatedly bent, and bubbles are prone to appear on the flexible display screen. The bubbles are caused by the separation and delamination of the flexible display panel 1 from the support layer 2, and would affect the product yield.

For better understanding of the technical solutions, several geometric concepts involved in the present disclosure are briefly introduced as follows.

Curved surface is a geometric graph, which is the trajectory of the continuous movement of a line segment in space, and the line segment forming the curved surface is referred to as a generatrix. A line segment controlling the movement of the generatrix is referred to as a directrix. The generatrix may be a straight line or a curve, and the directrix may be a straight line or a curve. An element line is a line segment of the generatrix at any position on the curved surface.

Figure 2:
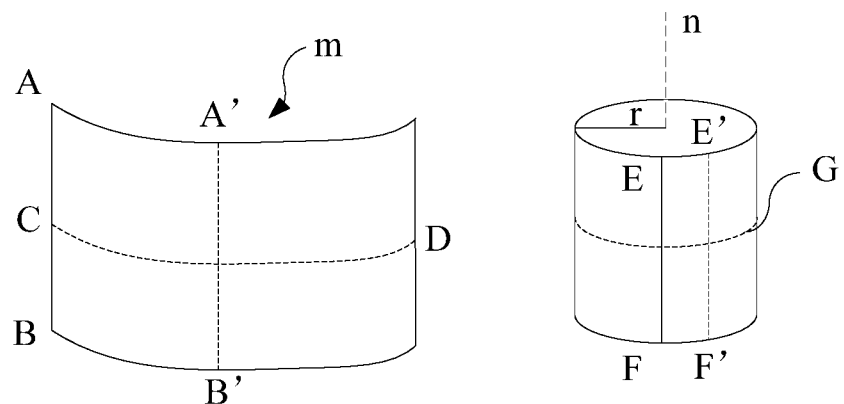
FIG. 2 is a geometric graph as an example according to the present disclosure.

FIG. 2 is a geometric graph as an example according to the present disclosure. FIG. 2 is a curved surface m. The curved surface m is the trajectory of the continuous movement of a line segment AB along a line segment CD. That is, as the line segment AB moves along the line segment CD, a surface swept by the line AB is the curved surface m. The line segment AB is the generatrix of the curved surface in, the line segment CD is the directrix of the curved surface in, and a line segment A'B' is the element line of the curved surface in. It can be seen that, for a cylindrical object, for example, the cylinder in FIG. 2, its generatrix on the side surface is a line segment EF, a line segment E'F' is the element line on the side surface of the cylinder; both the line segment EF and the line segment E'F' are parallel to an axis n of the cylinder; a spacing between the line segment EF and the axis n is a radius r of the cylinder; and a directrix G is a circle, a center of which is disposed on the axis n, and a radius of the circle is equal to the spacing between the line segment EF and the axis n.

Figure 3:
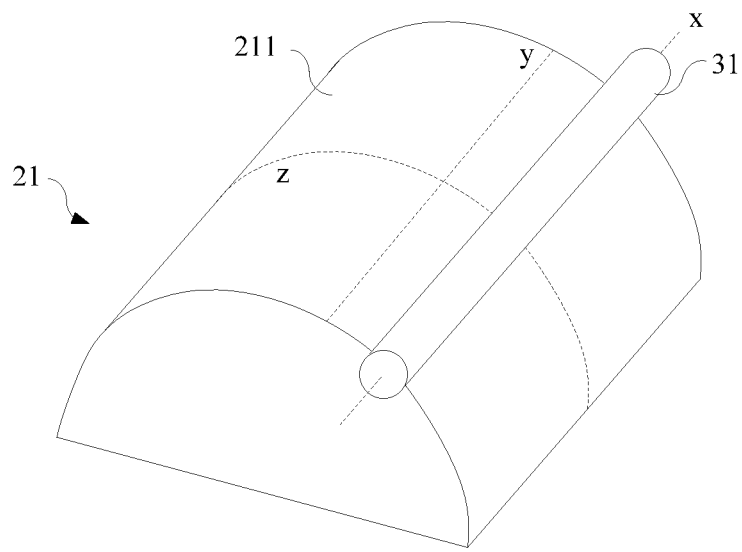
FIG. 3 is a schematic structural diagram of an apparatus for fabricating a flexible display screen according to an embodiment of the present disclosure.

FIG. 3 is a schematic structural diagram of an apparatus for fabricating a flexible display screen according to an embodiment of the present disclosure. As shown in FIG. 3, the apparatus includes a roller mechanism and a jig 21.

The jig 21 includes a bearing surface 211 configured to bear the flexible display panel, and the bearing surface 211 is a curved surface. The roller mechanism includes a roller 31, and an axis x of the roller 31 is parallel to an element line y of the bearing surface 211. The roller 31 is configured to roll on the bearing surface 211 along a directrix z of the bearing surface 211.

In the present disclosure, the bearing surface 211 is a part of an outer peripheral wall of a column. That is, the curved surface is a part of the outer peripheral wall of the column, for example, a part of the outer peripheral wall of a cylinder. The element line y is a straight line, and the directrix z is a curve.

By disposing the roller mechanism and the jig, wherein the bearing surface configured to bear the flexible display panel of the jig is a curved surface, the flexible display panel may be attached to the bearing surface in the process of fabricating the flexible display panel, such that the flexible display panel is kept bent. The roller mechanism includes a roller. Because the axis of the roller is parallel to the element line of the bearing surface, a distance between the roller and the bearing surface may be adjusted to attach the roller to the bearing surface. By rolling the roller on the bearing surface along the directrix of the bearing surface, the support layer may be attached to the flexible display panel. In an attachment process, the flexible display panel is kept in a bent state, and upon completion of the attachment, the flexible display structure exhibits a curvature. The support layer is attached in the case that the flexible display panel is kept bent, such that the flexible display panel is better bonded to the support layer, thereby reducing the possibility of separation and delamination of the flexible display panel from the support layer during normal use.

Optionally, an outer wall of the roller 31 includes a rubber layer, wherein the rubber layer may be deformed to an extent in the case that the roller 31 is pressed down, so as to avoid crushing the flexible display panel 1.

Optionally, a diameter of the roller 31 may range from 10 to 20 mm, for example, 16 mm.

Figure 4:
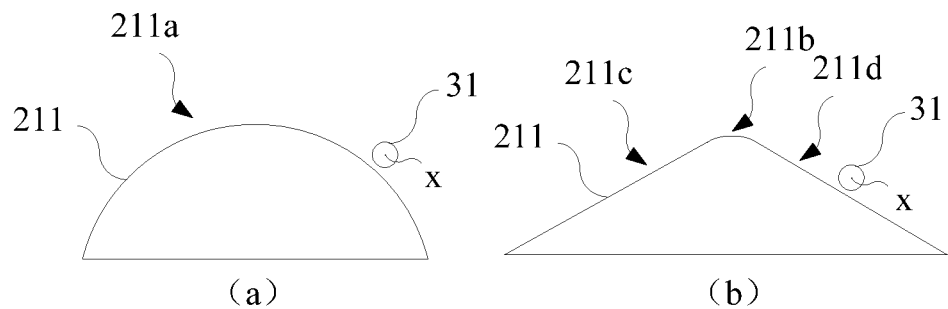
FIG. 4 is a schematic diagram of a comparison of two types of jigs according to an embodiment of the present disclosure.

FIG. 4 is a schematic diagram of a comparison of two types of jigs according to an embodiment of the present disclosure. As shown in FIG. 4, in each of the two types of jigs, an orthographic projection of the bearing surface 211 on a plane perpendicular to the axis x of the roller 31 is a curve. In one of the jigs, the curve is an arc curve 211a. The flexible display panel is bent into an arc shape in response to being attached to the jig. In the other jig, the curve includes a circular arc segment 211b, a first linear segment 211c, and a second linear segment 211d. One end of the first linear segment 211c is connected to and tangential to one end of the circular arc segment 211b, and one end of the second linear segment 211d is connected to and tangential to the other end of the circular arc segment 211b. The flexible display panel is approximately bent into an obtuse angle in response to being attached to the jig.

For the two types of jigs shown in FIG. 4, the angles corresponding to the arc curve 211a and the circular arc segment 211b may not exceed 180°. Overlarge angles corresponding to the arc curve 211a and the circular arc segment 211b are detrimental to the attachment of the support layer 2 to the flexible display panel 1. Illustratively, the angles corresponding to the arc curve 211a and the circular arc segment 211b may both be 120°. The diameters of the arc curve 211a and the circular arc segment 211b may be set according to the degree of bending required. For example, the diameter of the arc curve 211a may be 54 mm or 65 mm, and the diameter of the circular arc segment 211b may be 54 mm or 65 mm.

The two types of jigs shown in FIG. 4 may be the same in structure except for the shape of the bearing surface 211. The structure of the jig 21 is described below by taking the jig shown in FIG. 4 (a) as an example.

Figure 5:
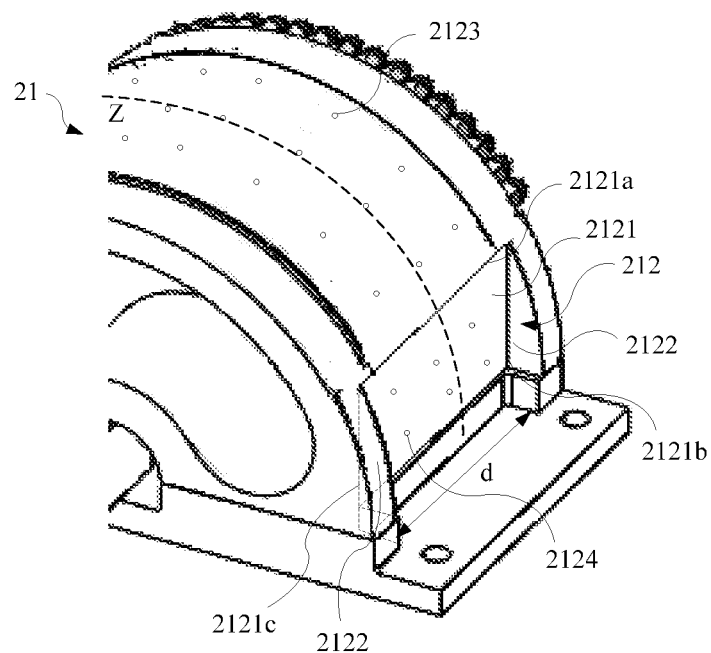
FIG. 5 is a schematic diagram of a partial structure of a jig according to an embodiment of the present disclosure.

FIG. 5 is a schematic diagram of a partial structure of a jig according to an embodiment of the present disclosure. As shown in FIG. 5, the bearing surface 211 of the jig 21 includes a flexible-circuit-hoard positioning groove 212, wherein the flexible-circuit-board positioning groove 212 is disposed on one end of the bearing surface 211 along a direction of the directrix z. For the bearing surface 211 of the jig shown in FIG. 5, the directrix thereof is an arc curve. The flexible display panel generally includes a panel body and a flexible circuit hoard. In the case of attaching the flexible display panel to the support layer, the flexible circuit board may be disposed in the flexible-circuit-board positioning groove 212 to prevent the roller 31 from crushing the flexible circuit board; and the flexible circuit board may be positioned by the flexible-circuit-hoard positioning groove 212, such that the flexible display panel is accurately disposed in place on the bearing surface 211.

Along a direction of the element line y of the bearing surface 211, a width d of the flexible-circuit-board positioning groove 212 may be less than a length of the roller 31, such that the roller 31 is prevented from entering the flexible-circuit-board positioning groove 212.

The flexible-circuit-board positioning groove 212 may include a bottom surface 2121 and two opposite side surfaces 2122. The bottom surface 2121 may include a first side edge 2121a, a second side edge 2121b, and a third side edge 2121c. One end of the first side edge 2121a is connected to one end of the second side edge 2121b. The other end of the first side edge 2121a is connected to one end of the third side edge 2121c. The first side edge 2121a of the bottom surface 2121 may be connected to the bearing surface 211, one of the side surfaces 2122 is connected to the second side edge 2121b, the other side surface 2122 is connected to the third side edge 2121c, and the two side surfaces 2122 are further connected to the bearing surface 211. In the case of disposing the flexible display panel on the bearing surface 211, the flexible circuit hoard may be bent to be attached to the bottom surface 2121 at a connection between the flexible display panel and the flexible circuit board, and the two side surfaces 2122 may position the two sides of the flexible circuit board.

Figure 6:
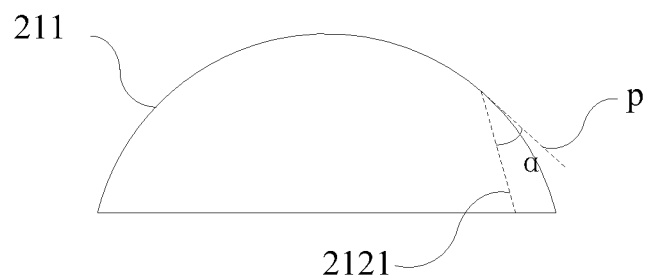
FIG. 6 is a front view of the jig shown in FIG. 5.

The first side edge 2121a may be parallel to the element line y of the bearing surface 211. FIG. 6 is a front view of the jig shown in FIG. 5. As shown in FIG. 6, an included angle α formed between the bottom surface 2121 and a tangent plane p of the bearing surface 211 at the first side edge 2121a is an acute angle, which is beneficial to reducing an angle corresponding to bending the flexible circuit board to the bottom surface 2121 in the case of attaching the flexible circuit board.

As shown in FIG. 5, the jig 21 may further include a vacuum adsorption structure, wherein the vacuum adsorption structure may include a plurality of panel adsorption holes 2123 and a plurality of flexible-circuit-board adsorption holes 2124. The panel adsorption holes 2123 may adsorb the panel body of the flexible display panel to the bearing surface 211 in the case of attaching the flexible display panel, and the flexible-circuit-hoard adsorption holes 2124 may adsorb the flexible circuit board connected to the panel body.

The flexible-circuit-board adsorption holes 2124 may be disposed in the flexible-circuit-board positioning groove 212, and the panel adsorption holes 2123 may be disposed outside the flexible-circuit-board positioning groove 212.

Figure 7:
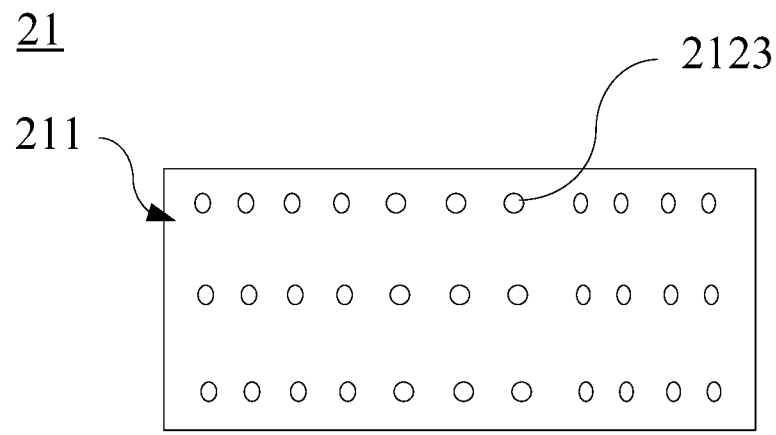
FIG. 7 is a top view of a jig according to an embodiment of the present disclosure.

FIG. 7 is a top view of a jig according to an embodiment of the present disclosure. The flexible-circuit-board positioning groove is omitted in the accompanying drawing. As shown in FIG. 7, the panel adsorption holes 2123 may be uniformly disposed outside the flexible-circuit-board positioning groove 212. In the case of placing the flexible display panel 1 on the bearing surface 211, the roller 31 may be rolled along the bearing surface 211 to gradually attach the flexible display panel 1 to the bearing surface 211. During the attachment process, the panel adsorption holes 2123 do not provide vacuum adsorption at first; and with the movement of the roller 31, the panel adsorption holes 2123 at different positions start to provide vacuum adsorption sequentially, thereby gradually adsorbing the flexible display panel 1 to the bearing surface 211.

In the case that the flexible display panel 1 is adsorbed onto the bearing surface 211, the support layer 2 may be attached to the flexible display panel 1 by the roller mechanism. The roller mechanism is further described as follows.

Figure 8:
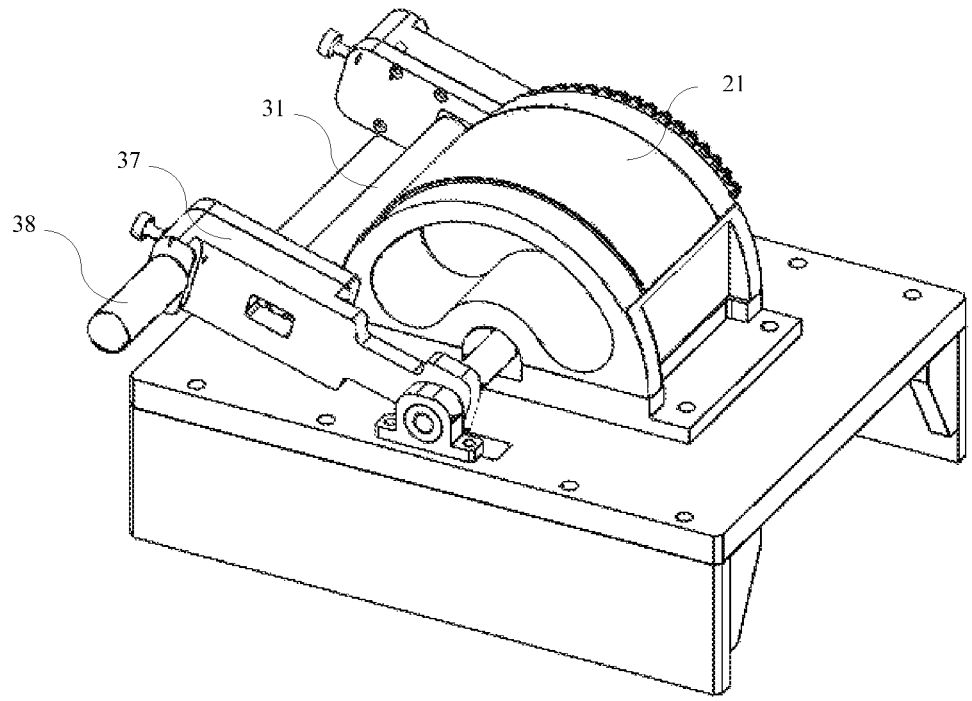
FIG. 8 is a schematic structural diagram of an apparatus for fabricating a flexible display screen according to an embodiment of the present disclosure.

FIG. 8 is a schematic structural diagram of an apparatus for fabricating a flexible display screen according to an embodiment of the present disclosure. The jig of the apparatus is the jig shown in a part (a) in FIG. 4, and the bearing surface 211 is a curved surface. As shown in FIG. 8, the roller mechanism of the apparatus includes a roller 31 and a pair of connection arms 37, and one end of each of the pair of connection arms 37 is articulated with the jig 21. The articulated axes of the connection arms 37 are parallel to the element line y of the bearing surface 211, and the roller 31 is rotatably disposed between the pair of connection arms 37. By rotating the pair of connection arms 37, the roller 31 may be driven to roll along the bearing surface 211, which is convenient to operate.

The connection arm 37 may be driven by a power device such as a motor. For example, the end of the connection arm 37 articulated with the jig 21 may be in transmission connection to a revolving shaft of the motor, and the connection arm 37 may be driven to rotate during the rotation of the motor.

The connection arm 37 may further be rotated by manual control. As shown in FIG. 8, the connection arm 37 may be disposed with a handle 38 to help an operator to rotate the connection arm 37. One end of the connection arm 37 is articulated with the jig 21, and the other end of the connection arm 37 may be disposed with a handle 38. In this way, the connection arms 37 may be rotated more conveniently.

Optionally, the roller 31 is disposed on the connection arm 37 in such a fashion that the roller 31 is movable along a length direction of the connection arm 37, and the connection arm 37 may be disposed with a compression mechanism, wherein the compression mechanism is configured to supply a force to cause the roller 31 to move towards the bearing surface 211. In this way, the roller 31 may be move towards the bearing surface 211 by the compression mechanisms, and the roller 31 may compress the bearing surface 211.

Figure 9:
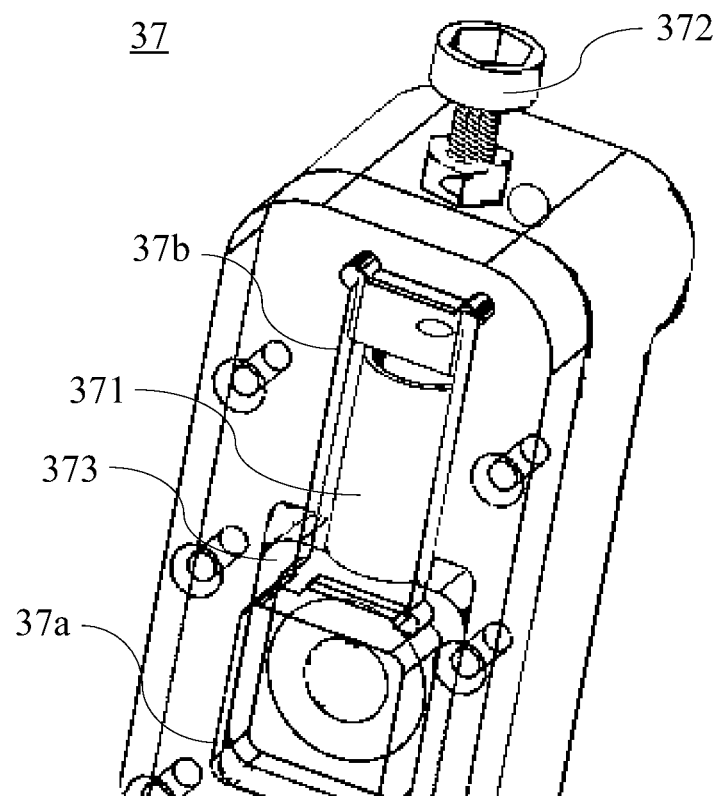
FIG. 9 is a schematic diagram of a partial structure of a connecting rod in FIG. 8.

FIG. 9 is a schematic diagram of a partial structure of a connecting rod in FIG. 8. As shown in FIG. 9, the connection arm 37 may include an insertion hole 37a, and an axial through hole 37b extending along a length direction of the connection arm 37. The insertion hole 37a may be disposed on a side wall of the connection arm 37 and connected to the axial through hole 37b. One end of the roller 31 may be inserted into the insertion hole 37a. The compression mechanism may include a spring 371 and an adjusting bolt 372. One end of the adjusting bolt 372 is disposed in the axial through hole 37b, the spring 371 is coaxially disposed in the axial through hole 37b, and two ends of the spring 371 are respectively in contact with the adjusting bolt 372 and the roller 31. By changing a length of the adjusting bolt 372 in the axial through hole 37b, the compression amount of the spring 371 may be changed, thereby changing the magnitude of the force described above. For example, the adjusting bolt 372 is twisted to increase the length of the adjusting bolt 372 in the axial through hole 37b, such that the spring 371 is compressed and the elastic force increases, thereby increasing the pressing force of the roller 31 against the bearing surface 211.

A sliding seat 373 may be disposed in each of the insertion holes 37a. The sliding seat 373 may slide along the length direction of the connection arm 37 in the insertion hole 37a, the roller 31 may be inserted in the sliding seat 373, and the spring 371 may be abutted against the sliding seat 373.

Figure 10:
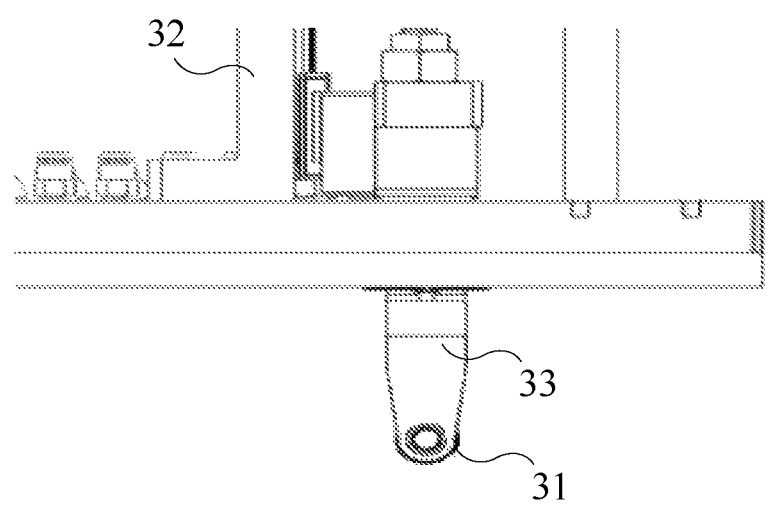
FIG. 10 is a schematic structural diagram of a roller mechanism of another apparatus for fabricating a flexible display screen according to an embodiment of the present disclosure.

FIG. 10 is a schematic structural diagram of a roller mechanism of another apparatus for fabricating a flexible display screen according to an embodiment of the present disclosure. As shown in FIG. 10, the roller mechanism includes a roller 31, a mounting frame 32, and a pressing rod 33, wherein the mounting frame 32 is disposed above the jig 21. The pressing rod 33 is disposed on the mounting frame 32, and the roller 31 is rotatably disposed on an end of the pressing rod 33. The pressing rod 33 may supply a downward pressing force to the roller 31, so as to press the flexible display panel 1 to the bearing surface 211, and press the support layer 2 to the flexible display panel 1.

For example, the pressing rod 33 may supply the downward pressing force to the roller 31 in the following two fashions.

In a possible implementation, the pressing rod 33 may include a telescopic cylinder, wherein the telescopic cylinder is connected to the mounting frame 32. A telescopic rod of the telescopic cylinder is connected to the roller 31. The telescopic cylinder may be an air cylinder or a hydraulic cylinder. By the expansion and contraction of the telescopic cylinder, the roller 31 may be driven to move, thereby supplying the downward pressing force to the roller 31.

In another possible implementation, the mounting frame 32 may be a movable frame that is liftable. The pressing rod 33 is fixed on the mourning frame 32, and the pressing rod 33 and the roller 31 are driven by the promotion and demotion of the mounting frame 32, thereby supplying the downward pressing force to the roller 31.

An apparatus with the roller mechanism shown in FIG. 10 may further include a horizontal movement mechanism, wherein the horizontal movement mechanism may be configured to allow the roller mechanism and the jig 21 to move towards each other along a horizontal direction that is perpendicular to the axis of the roller 31. For example, the horizontal movement mechanism may be configured to drive the jig 21 or the roller mechanism to move along the horizontal direction, or to drive the jig 21 and the roller mechanism to move along the horizontal direction. In this way, in the case of fabricating the flexible display screen, the pressing rod 33 in the roller mechanism may drive the roller 31 to move along a vertical direction, and the horizontal movement mechanism make the roller mechanism and the jig 21 move towards each other along the horizontal direction. Taking the jig 21 as a reference, the roller 31 may roll along the bearing surface 211 according to the motion synthesis principle.

Illustratively, the horizontal movement mechanism may include a linear motor, wherein the linear motor is connected to the jig 21 or the roller mechanism to drive the jig 21 or the roller mechanism to move linearly. Or, the horizontal movement mechanism may include two linear motors, wherein the two linear motors are respectively connected to the jig 21 and the roller mechanism to drive the jig 21 and the roller mechanism to move.

Figure 11:
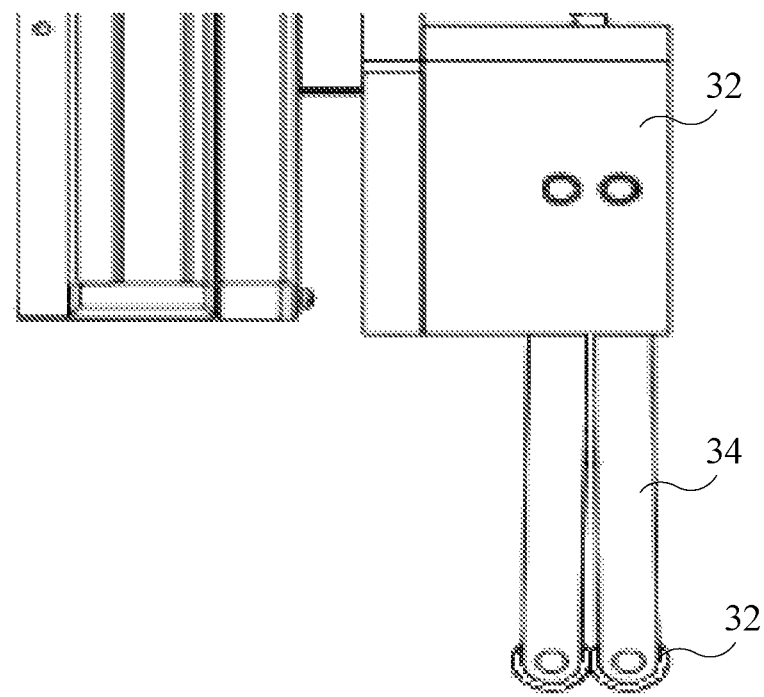
FIG. 11 is a schematic structural diagram of another roller mechanism according to an embodiment of the present disclosure.

FIG. 11 is a schematic structural diagram of another roller mechanism according to an embodiment of the present disclosure. As shown in FIG. 11, the roller mechanism includes two rollers 31, a mounting frame 32, and two support rods 34. The mounting frame 32 is disposed above the jig 21. One end of each of the two support rods 34 is articulated on the mounting frame 32, and the other end of each of the two support rods 34 is disposed with one rotatable rollers 31. Articulated axes of the two support rods 34 are parallel to the axes x of the two rollers 31. During the use in combination the jig 21, the support rods 34 and the rollers 31 are driven by the mounting frame 32 to press down, the rollers 31 are further pressed down with the mounting frame 32 in response to being in contact with the jig 21, the two support rods 34 gradually spread, and the two rollers 31 roll on the bearing surface 211 along opposite directions. In this way, the two rollers 31 supply forces simultaneously, which is conducive to improving the production efficiency. For example, in the case of attaching the flexible display panel to the jig 21, the two rollers 31 are first contacted with the middle of the flexible display panel to press the middle of the flexible display panel onto the bearing surface 211. Then, in the process of further pressing down the mounting frame 32, the two rollers 31 press regions on both sides of the middle of the flexible display panel onto the bearing surface 211.

Optionally, a distance between the articulated axes of the two support rods 34 may be less than the minimum spacing between the axes of the two rollers 31. That is, in the case of rotating the two support rods 34 until the two rollers 31 are in contact with each other, the distance between the articulated axes of the two support rods 34 is less than a distance between the axes of the two rollers 31. In this way, it is convenient to spread the two support rods 34 in the case that the rollers 31 are pressed down.

Figure 12:
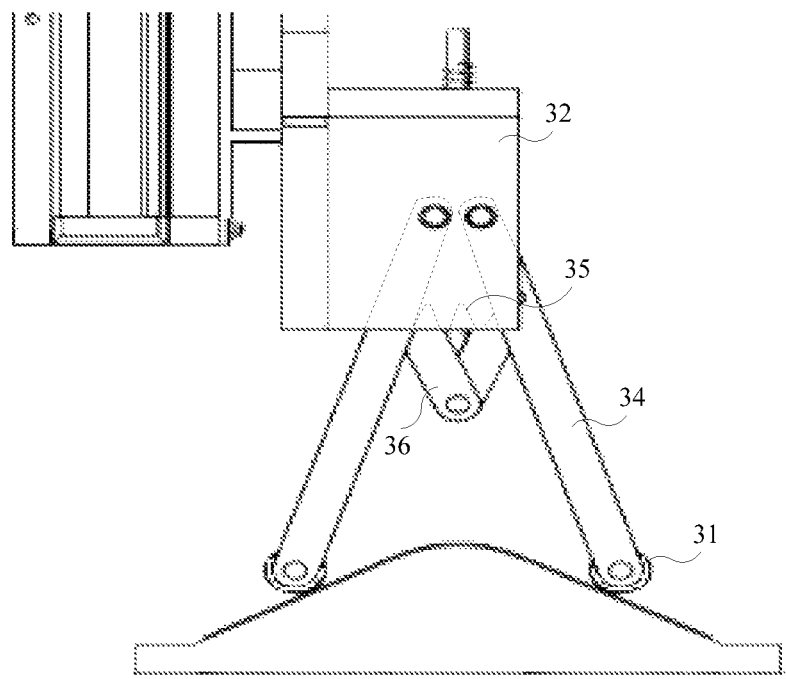
FIG. 12 is a schematic diagram of a working state of the roller mechanism shown in FIG. 11.

FIG. 12 is a schematic diagram of a working state of the roller mechanism shown in FIG. 11. As shown in FIG. 12, the two support rods 34 is connected by an elastic restoring member 35, wherein the elastic restoring member 35 is configured to supply a force to cause the two support rods 34 to move towards each other. The elastic restoring member 35 may pull the two support rods 34 to move towards each other in the case that the mounting frame 32 moves upwards. Moreover, the force of the elastic restoring member 35 on the support rods 34 further includes a component force perpendicular to the support rods 34. Under the action of the component force, the rollers 31 may press the jig 21 more tightly to attach the flexible display panel and the support layer into a whole. Illustratively, the elastic restoring member 35 may be a spring.

As shown in FIG. 12, the roller mechanism may further include two connecting rods 36. One end of one of the connecting rods 36 is articulated with one of the support rods 34, one end of the other connecting rod 36 is articulated with the other support rod 34. The two connecting rods 36 are articulated with each other. In the case of spreading the two support rods 34, the two connecting rods 36 spread to each other; and in the case of moving towards the two support rods 34, the two connecting rods 36 move towards each other. The configuration of the two connecting rods 36 may increase the stability in opening and closing the two support rods 34, and may further limit the maximum opening angle corresponding to the two support rods 34.

The roller mechanisms shown in FIG. 10 and FIG. 11 may be used in combination with any jig shown in the part (a) in FIG. 4 or the jig shown in the part (b) in FIG. 4.

Figure 13:
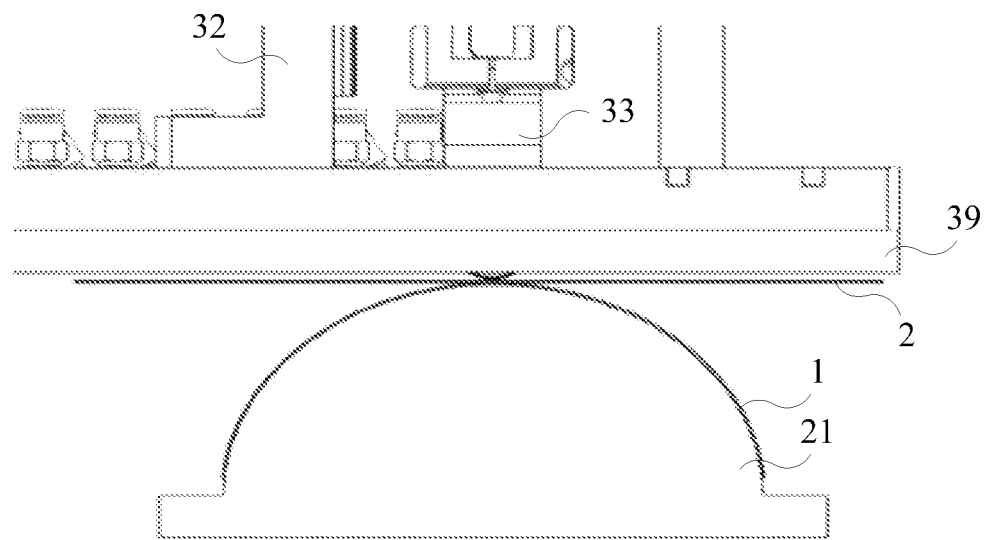
FIG. 13 is a schematic structural diagram of an apparatus for fabricating a flexible display screen according to an embodiment of the present disclosure.
Figure 14:
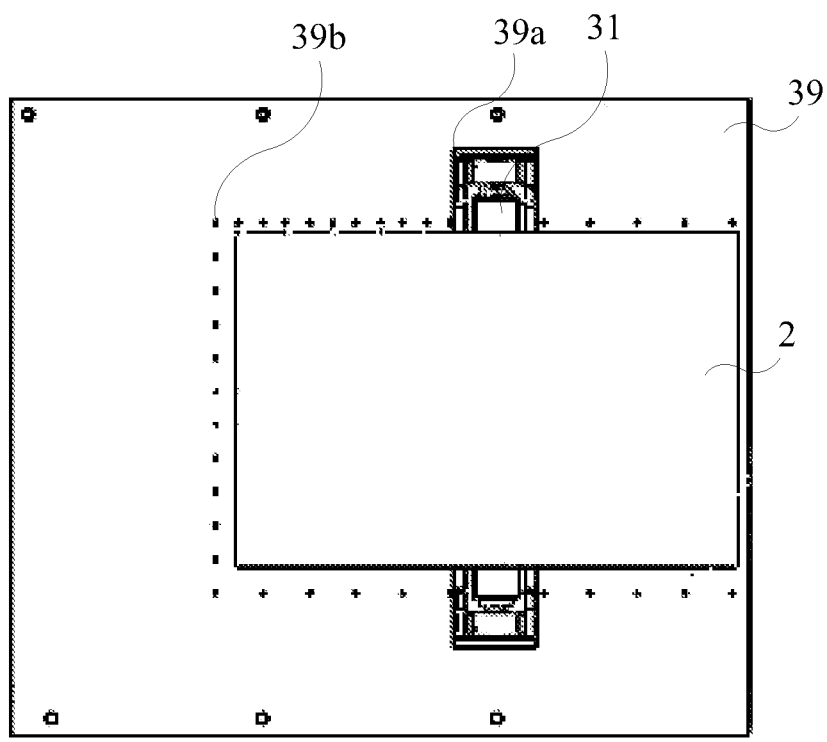
FIG. 14 is a bottom view of an adsorption plate shown in FIG. 13.

In order to further facilitate fabrication of the flexible display screen, the roller mechanism according to the embodiments of the present disclosure may further include an adsorption plate. FIG. 13 is a schematic structural diagram of an apparatus for fabricating a flexible display screen according to an embodiment of the present disclosure. As shown in FIG. 13, the adsorption plate 39 may be connected to the mounting frame 32. The adsorption plate 39 may be disposed above the jig 21. FIG. 14 is a bottom view of an adsorption plate shown in FIG. 13. As shown in FIG. 14, the adsorption plate 39 is provided with a roller clearance hole 39a and a plurality of vacuum adsorption holes 39b, the roller clearance hole 39a is strip-shaped, and a plurality of the vacuum adsorption holes 39b are disposed on both sides of the roller clearance hole 39a. In the case of attaching the flexible display panel to the jig, the flexible display panel may be first adsorbed onto the adsorption plate 39, and then the middle of the flexible display panel is pressed down to the jig 21 by pressing down the rollers 31. With the rollers 31 roll, the flexible display panel is gradually released and is attached to the jig 21. In the case of attaching the support layer to the flexible display panel, the support layer may be first adsorbed onto the adsorption plate 39, and then the middle of the flexible display panel is pressed down to the jig 21 by pressing down the rollers 31. With the rollers 31 roll, the support layer is gradually released and is attached to the flexible display panel.

FIG. 13 exemplarily illustrates the apparatus for fabricating the flexible display screen shown in FIG. 10. For the apparatus shown in FIG. 11, the adsorption plate 39 of the structure may further be provided, and the jig 21 may further be any of the jigs shown in FIG. 4.

Figure 15:
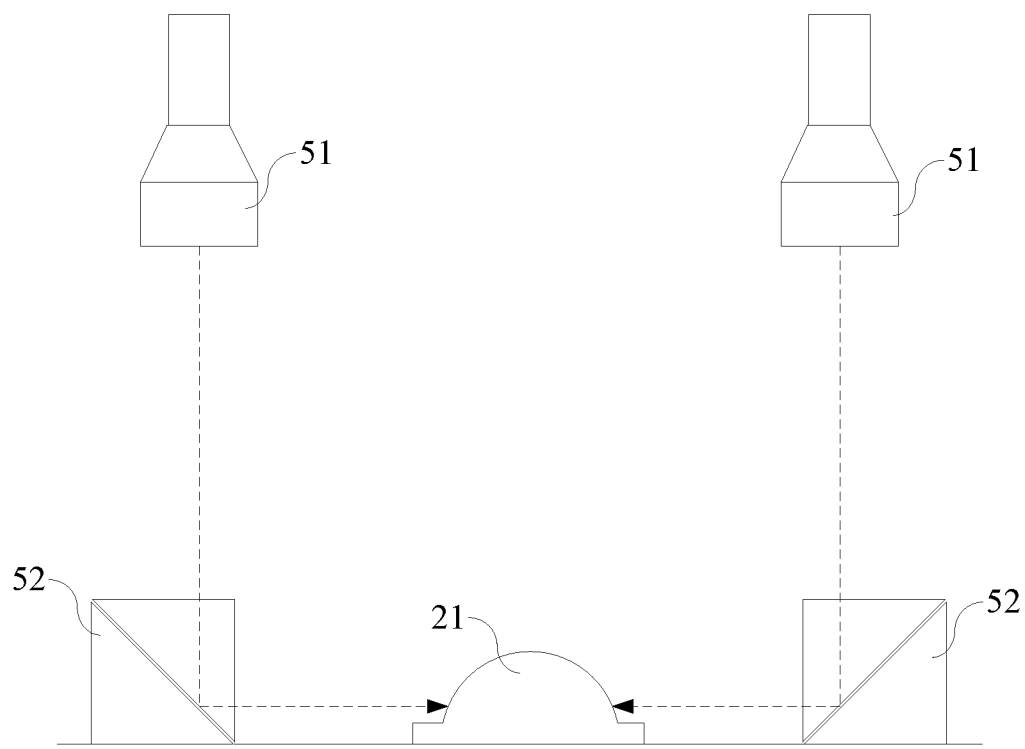
FIG. 15 is a diagram of the principle of a visual alignment mechanism according to an embodiment of the present disclosure.

Optionally, the apparatus may further include a visual alignment mechanism. FIG. 15 is a diagram of the principle of a visual alignment mechanism according to an embodiment of the present disclosure. As shown in FIG. 15, the visual alignment mechanism may include a charge-coupled device (CCD) 51. After the flexible display panel 1 is attached to the jig 21, the flexible display panel 1 may be photographed by the CCD 51 to facilitate adjustment of the position of the jig 21 relative to the rollers 31, such that the support layer 2 is more accurately attached to the flexible display panel 1, and the dislocation between the support layer 2 and the flexible display panel 1 is avoided.

The CCD 51 may be disposed on the adsorption plate 39, which is convenient for photographing the flexible display panel 1.

Optionally, the visual alignment mechanism may further include a reflective mirror 52. The reflective mirror 52 may be configured to reflect light, which helps the CCD 51 to photograph the flexible display panel. Because the flexible display panel 1 is in a bent state in response to being attached to the jig 21, it is difficult for the CCD 51 to completely photograph two ends of the flexible display panel 1 above the jig 21. The reflective mirror 52 may be disposed to reflect light, such that the CCD 51 photographs two ends of the flexible display panel 1 by the reflective mirror 52. In the case of photographing the flexible display panel 1, the reflective mirror 52 may be placed on the same workbench as the jig 21.

After the support layer 2 is attached to the flexible display panel 1, the support layer 2 and the flexible display panel 1 may be removed from the jig 21 as a whole for subsequent processing. The apparatus for fabricating the flexible display screen according to the embodiments of the present disclosure may further include a transfer mechanism, wherein the transfer mechanism is configured to remove the support layer 2 and the flexible display panel 1 from the jig.

Figure 16:
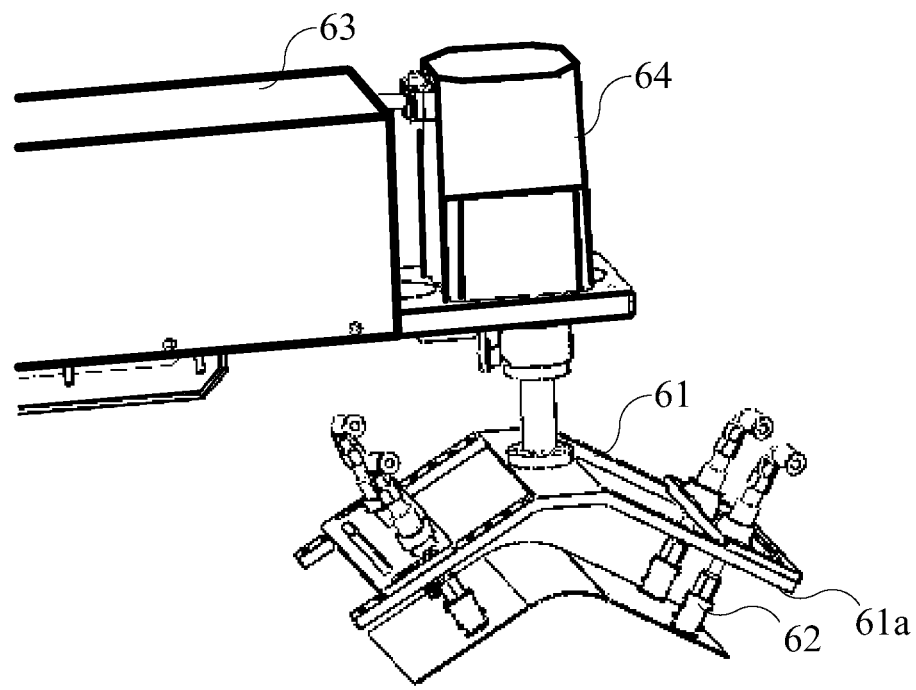
FIG. 16 is a schematic structural diagram of a transfer mechanism according to an embodiment of the present disclosure.

FIG. 16 is a schematic structural diagram of a transfer mechanism according to an embodiment of the present disclosure. As shown in FIG. 16, the transfer mechanism includes a transfer bracket 61 and a plurality of suckers 62. The transfer bracket 61 includes a sucker mounting surface 61*a*, wherein the sucker mounting surface 61*a* is a concave surface. The shape of the sucker mounting surface 61*a* may be matched with the bearing surface 211 of the jig 21, and the plurality of suckers 62 are disposed on the sucker mounting surface 61*a*. The attached support layer and flexible display panel may be removed from the jig by moving the transfer bracket 61 towards the bearing surface 211 to cause the plurality of suckers 62 to be sucked to the support layer.

Optionally, the length of the suckers 62 are adjustable. Because the sucker mounting surface 61*a* is not flat, the spacing between the suckers 62 may be changed by adjusting the lengths of the plurality of suckers 62. The spacing between the suckers 62 is decreased with the elongation of the chucks 62, and the spacing between the suckers 62 becomes larger with the shortening of the chucks 62. In the case of sucking the support layer with a large area, the lengths of the suckers 62 may be decreased to increase the spacing between the suckers 62. In the case of sucking the support layer with a small area, the lengths of the suckers 62 may be increased to reduce the spacing between the suckers 62.

As shown in FIG. 16, the transfer mechanism may further include a manipulator 63. The transfer bracket 61 may be connected to one end of the manipulator 63, such that the transfer bracket 61 is driven to move by the manipulator 63. The end of the manipulator 63 may be disposed with a steering motor 64, and the transfer bracket 61 may be connected to a revolving shaft of the steering motor 64. The steering motor 64 may drive the transfer bracket 61 to rotate, thereby facilitating the alignment of the suckers 62 with the support layer.

After being removed from the jig as a whole, the support layer and the flexible display panel may be stored in a centralized fashion to facilitate subsequent processing. The apparatus for fabricating the flexible display screen according to the embodiments of the present disclosure may further include a panel bracket, wherein the panel bracket is configured to hold the attached support layer and flexible display panel.

Figure 17:
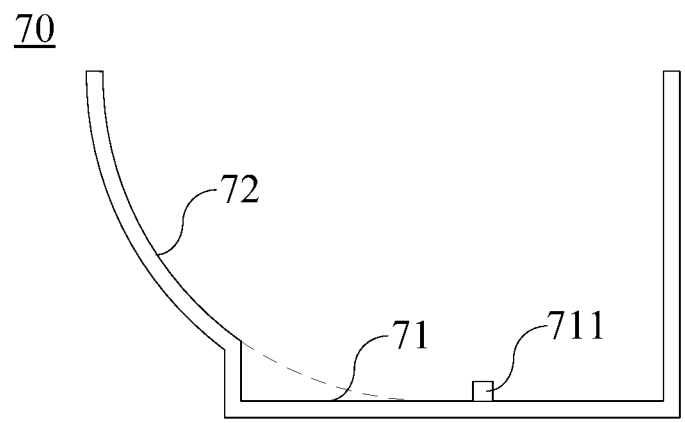
FIG. 17 is a side view of a panel bracket according to an embodiment of the present disclosure.
Figure 18:
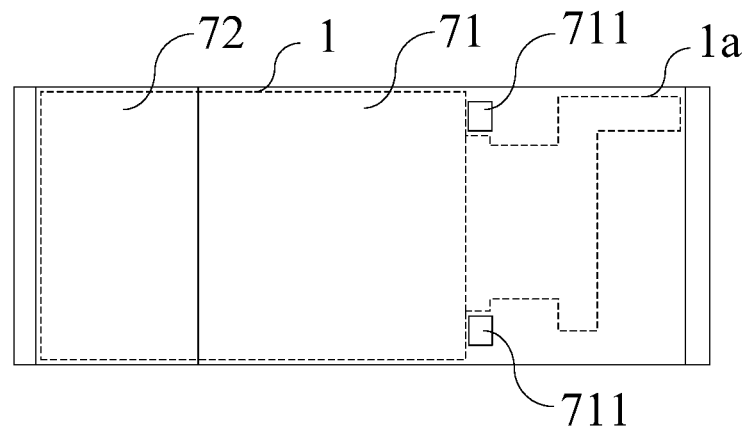
FIG. 18 is a top view of the panel bracket shown in FIG. 17.

FIG. 17 is a side view of a panel bracket according to an embodiment of the present disclosure. As shown in FIG. 17, the panel bracket 70 includes a horizontal support surface 71 and a curved support surface 72. A dotted line in FIG. 17 represents a curved plane of the curved support surface 72. The dotted line is tangential to the horizontal support surface 71, that is, the curved plane of the curved support surface 72 is tangential to the horizontal support surface 71. The horizontal support surface 71 includes a stop protrusion 711. The attached support layer 2 and flexible display panel 1 have a curvature, and may be placed on the curved support surface 72. By the support of the curved support surface 72, the flexible circuit board 1*a* connected to the flexible display panel 1 may be laid flat on the horizontal support surface 71. FIG. 18 is a top view of the panel bracket shown in FIG. 17. As shown in FIG. 18, the stop protrusion 711 may block a side edge, connected to the flexible circuit board 1*a*, of the flexible display panel 1, thereby preventing the flexible display panel 1 from sliding from the curved support surface 72. The shape of the panel bracket 70 matches the flexible display panel 1, such that the flexible display panel 1 is placed more stably.

Optionally, the panel bracket 70 may be a stamped part, which is stamped from a thin plate and is easy to fabricate.

After being removed from the jig as a whole and stored in a centralized fashion, the support layer and the flexible display panel may be moved to a next workbench for flattening the flexible display panel and disposing a cover plate glass. The apparatus for fabricating the flexible display screen according to the embodiments of the present disclosure may further include a flattening jig, wherein the flattening jig is configured to flatten the flexible display panel and dispose the cover plate glass.

Figure 19:
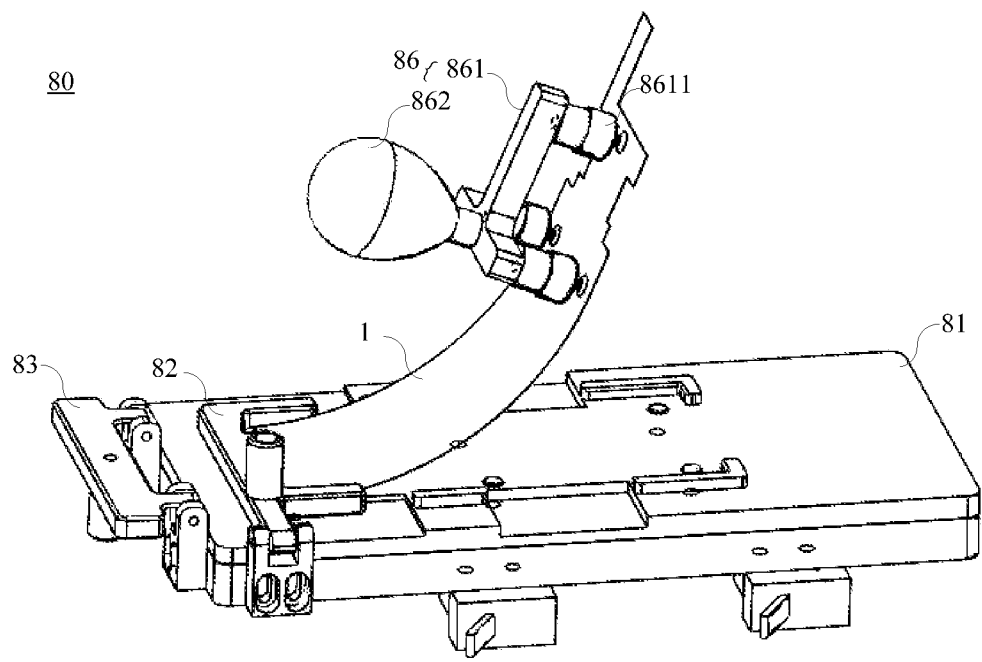
FIG. 19 is a schematic structural diagram of a flattening jig according to an embodiment of the present disclosure.
Figure 20:
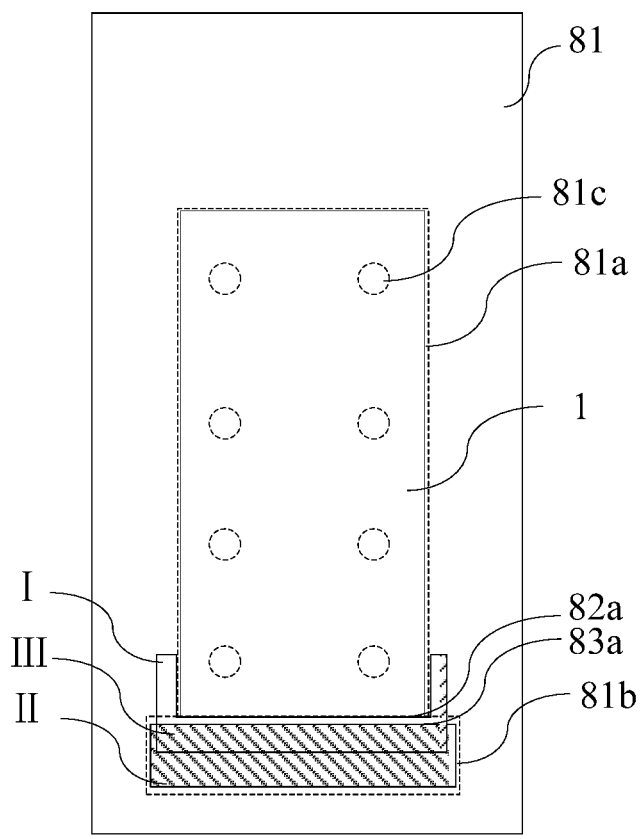
FIG. 20 is a top view of a carrier according to an embodiment of the present disclosure.

FIG. 19 is a schematic structural diagram of a flattening jig according to an embodiment of the present disclosure. As shown in FIG. 19, the flattening jig 80 may include a carrier 81, a first positioning stopper 82, and a second positioning stopper 83. Both the first positioning stopper 82 and the second positioning stopper 83 are rotatably connected to the carrier 81. FIG. 20 is a top view of a carrier according to an embodiment of the present disclosure. As shown in FIG. 20, the carrier 81 includes a flexible-display-panel drop zone 81a, and a positioning-stopper drop zone 81b disposed on a side of the flexible-display-panel drop zone 81a.

A hatched portion I in FIG. 20 is an orthographic projection of the first positioning stopper 82 on the carrier 81 in the case that the first positioning stopper 82 is disposed in the positioning-stopper drop zone 81b. A hatched portion II in FIG. 20 is an orthographic projection of the second positioning stopper 83 on the carrier 81 in the case that the second positioning stopper 83 is disposed in the positioning-stopper drop zone 81b. In FIG. 20, a hatched portion III is an overlap region of the hatched portion I and the hatched portion II. As shown in FIG. 20, the first positioning stopper 82 is configured to provide a positioning surface configured to position the flexible display panel in the case that the first positioning stopper 82 is disposed in the positioning-stopper drop zone 81b, wherein an orthographic projection of the positioning surface on the positioning-stopper drop zone 81b covers a first boundary 82a. In the case of placing the flexible display panel in the flexible-display-panel drop zone 81a, the first positioning stopper 82 may be abutted against a side of the flexible display panel, thereby positioning the flexible display panel.

The second positioning stopper 83 is configured such that, in the case that the second positioning stopper 83 is disposed in the positioning-stopper drop zone 81b, an orthographic projection of a surface, proximal to the flexible-display-panel drop zone 81a, of the second positioning stopper 83 on the positioning-stopper drop zone 81b covers a second boundary 83a. As shown in FIG. 20, the second boundary 83a is spaced apart from the first boundary 82a, and the first boundary 82a is disposed between the second boundary 83a and the flexible-display-panel drop zone 81a. In the case of placing the flexible display panel in the flexible-display-panel drop zone 81a the second positioning stopper 83 may be spaced apart from a side of the flexible display panel.

A plurality of vacuum adsorption holes 81c may be disposed in the flexible-display-panel drop zone 81a to adsorb the flexible display panel 1.

Optionally, the flattening jig may further include a three-claw sucker 86, wherein the three-claw chuck 86 may be sucked onto the panel body of the flexible display panel and the flexible circuit board connected to the panel body. By simultaneously sucking the panel body of the flexible display panel and the flexible circuit board, the flexible circuit board may be kept spreading, which facilitates the placement of the flexible display panel on the carrier 81.

As shown in FIG. 19, the three-claw sucker 86 may include a main body 861 and an elastic airbag 862. The main body 861 includes three suction nozzles 8611, and the three suction nozzles 8611 are all connected to the elastic airbag 862. Air in the elastic airbag 862 may be squeezed out from the suction nozzles 8611 by squeezing the elastic airbag 862 in use. Then, the suction nozzles 8611 may be placed on the flexible display panel, such that the suction nozzles 8611 are blocked. Then, the elastic airbag 862 may be released, and a negative pressure is developed in the elastic airbag 862 under the elastic action of the elastic airbag 862, such that the suction nozzles 8611 suck the flexible display panel.

Prior to placing the flexible display panel in the flexible-display-panel drop zone 81a of the carrier 81, the first positioning stopper 82 may be turned over, such that the first positioning stopper 82 is disposed in the positioning-stopper drop zone 81b. In the case of placing the flexible display panel, a side of the flexible display panel may be attached to the first positioning stopper 82 (for example, as shown in FIG. 19) for positioning by the first positioning stopper 82.

Then, the flexible display panel is adsorbed onto the flexible-display-panel drop zone 81a.

Figure 21:
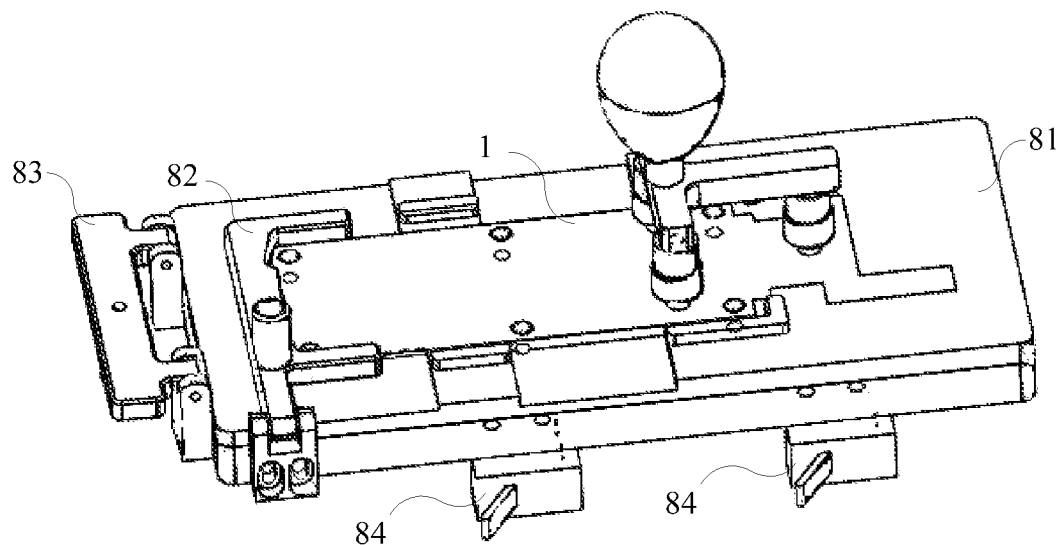
FIG. 21 is a schematic diagram of a state in which a flexible display panel is adsorbed in a vacuum adsorption zone.

FIG. 21 is a schematic diagram of a state in which a flexible display panel is adsorbed in a vacuum adsorption zone. As shown in FIG. 21, the carrier 81 includes two switches 84 for controlling the adsorption force of the vacuum adsorption holes 81c. Each of the two switches 84 may control a part of the vacuum adsorption holes 81c. In the case of placing the flexible display panel on the carrier 81, a side of the flexible display panel 1 may be first positioned by the first positioning stopper 82. Then, one of the two switches 84 may be operated, such that a part, proximal to the first positioning stopper 82, of the vacuum adsorption holes 81c adsorbs the flexible display panel 1, and then the flexible display panel 1 is subsequently flattened, and the other switch 84 may be operated, such that the remaining vacuum adsorption holes 81c are further adsorbed to the flexible display panel 1 to flatten the flexible display panel 1.

Figure 22:
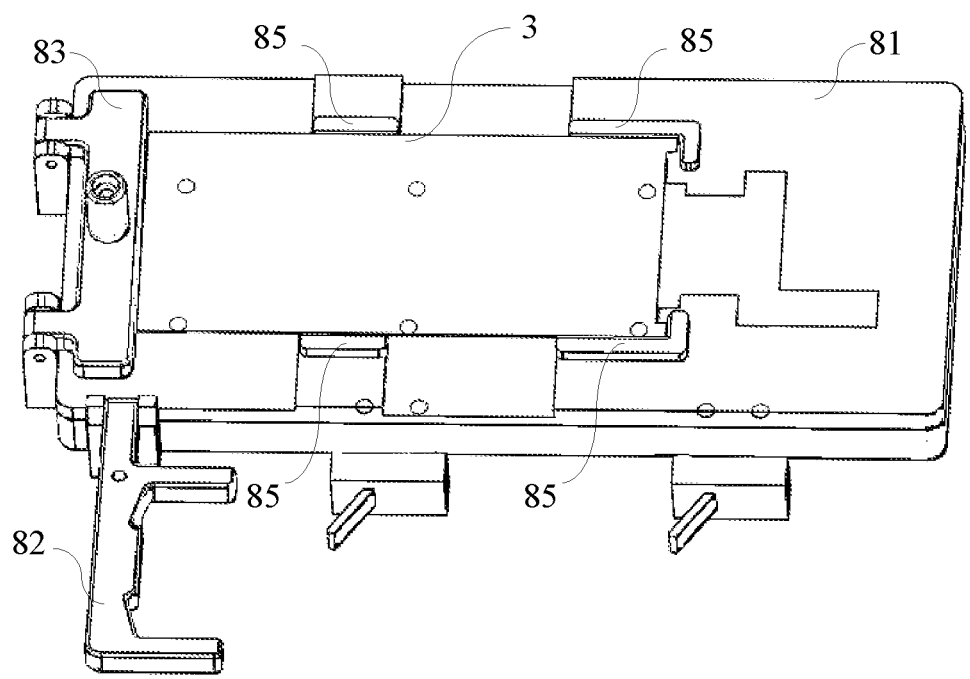
FIG. 22 is a schematic diagram of a use state of a flattening jig according to an embodiment of the present disclosure.

FIG. 22 is a schematic diagram of a use state of a flattening jig according to an embodiment of the present disclosure. As shown in FIG. 22, after the flexible display panel 1 is adsorbed to the flexible-display-panel drop zone 81a, the first positioning stopper 82 may be turned over such that the first positioning stopper 82 is turned outside the positioning-stopper drop zone 81b, the second positioning stopper 83 may be turned over such that the second positioning stopper 83 is turned to the positioning-stopper drop zone 81b. In this case, the cover plate glass 3 may be covered on the flexible display panel, and a side of the cover plate glass 3 may be attached to the second positioning stopper 83 to position the cover plate glass by the second positioning stopper 83.

For different flexible display screens, a shape of an edge of the flexible display panel 1 may be different from a shape of an edge of the cover plate glass 3, and the shapes of the first positioning stopper 82 and the second positioning stopper 83 may be configured based on the characteristics of the flexible display screen. In the embodiments, a depression is present in the middle of a side, attached to the first positioning stopper 82, of the shown flexible display panel 1, and a protrusion 821 is present in a corresponding portion of the first positioning stopper 82, such that the flexible display panel 1 is attached to the first positioning stopper 82 to improve the positioning accuracy.

As shown in FIG. 22, the carrier 81 may be further disposed with a plurality of positioning protrusions 85, wherein the plurality of positioning protrusions 85 may be arranged along the edge of the flexible-display-panel drop zone 81a to position the flexible display panel 1 and the cover plate glass 3 from multiple directions.

Figure 23:
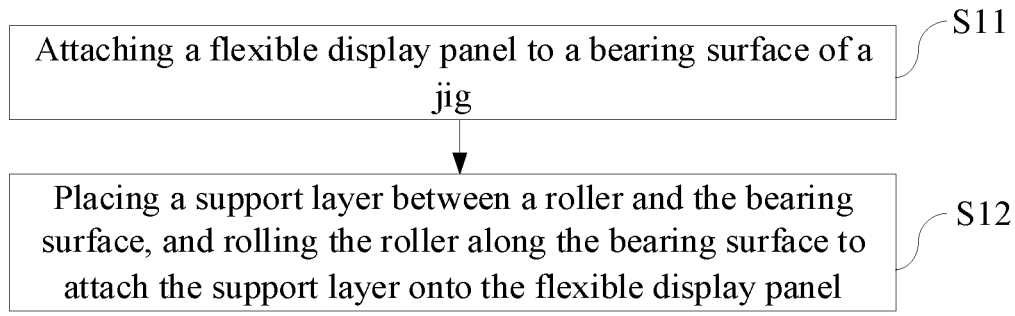
FIG. 23 is a flowchart of a method for fabricating a flexible display screen according to an embodiment of the present disclosure.

FIG. 23 is a flowchart of a method for fabricating a flexible display screen according to an embodiment of the present disclosure. The apparatus shown in FIG. 3 is applicable to the method. As shown in FIG. 23, the method includes the following processes.

In S11, a flexible display panel is attached to a bearing surface of a jig.

In S12, a support layer is placed between a roller and the bearing surface, wherein the roller is rolled along the bearing surface to attach the support layer to the flexible display panel.

By disposing the roller mechanism and the jig, the bearing surface of the jig is a curved surface configured to bear the flexible display panel, and the flexible display panel may be attached to the bearing surface in the case that the flexible display panel is fabricated, such that the flexible display panel is kept bent. The roller mechanism includes a roller. Because the axis of the roller is parallel to an element line of the bearing surface, a distance between the roller and the bearing surface may be adjusted to attach the roller to the bearing surface. By rolling the roller on the bearing surface along the directrix of the bearing surface, the support layer may be attached to the flexible display panel. In an attachment process, the flexible display panel is kept in a bent state, and upon completion of the attachment, the flexible display structure exhibits a curvature. By attaching the support layer in the case that the flexible display panel is kept bent, the flexible display panel can be better bonded to the support layer, thereby decreasing the possibility of separation and delamination of the flexible display panel from the support layer during normal use.

Figure 24:
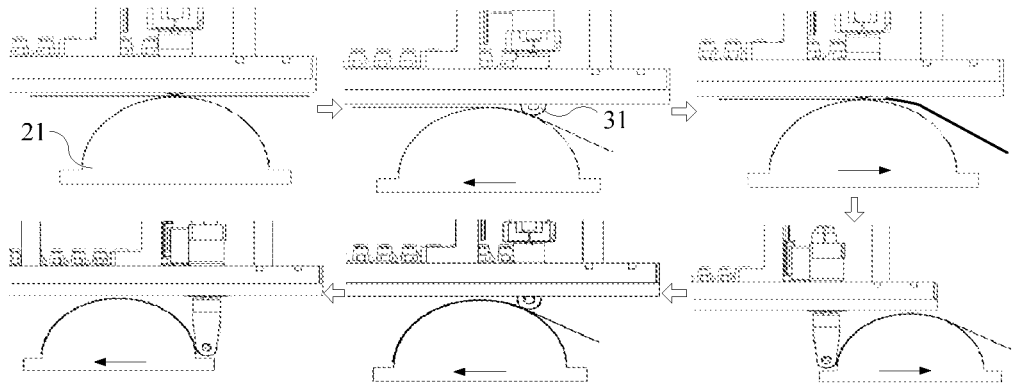
FIG. 24 is a schematic diagram of a process of fabricating a flexible display screen according to an embodiment of the present disclosure.
Figure 25:
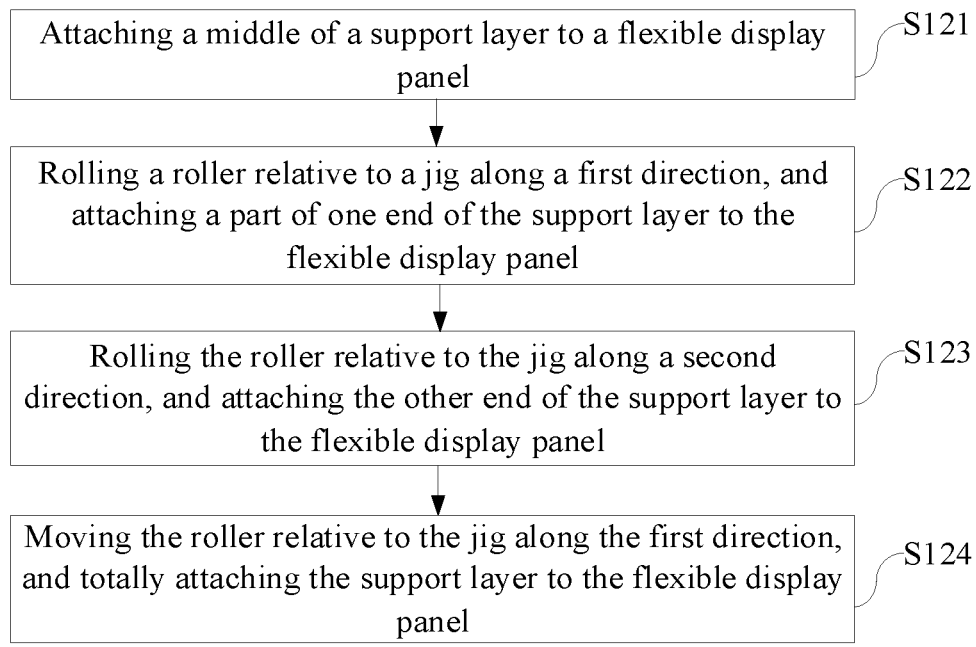
FIG. 25 is a flowchart of a method for rolling a roller column along a bearing surface according to an embodiment of the present disclosure.

FIG. 24 is a schematic diagram of a process of fabricating a flexible display screen according to an embodiment of the present disclosure. For the apparatus shown in FIG. 10, the roller may be rolled along the bearing surface by the method shown in FIG. 25 in combination with FIG. 24.

In S121, a middle of a support layer is attached to a flexible display panel.

In S122, a roller is rolled relative to a jig along a first direction, and a part of one end of the support layer is attached to the flexible display panel.

A movement direction of the jig 21 is illustrated by an arrow in FIG. 24, and the movement direction of the roller 31 relative to the jig 21 is opposite to the direction of the arrow.

In S123, the roller is rolled relative to the jig along a second direction, and the other end of the support layer is attached to the flexible display panel.

The second direction is opposite to the first direction.

In S124, the roller is moved relative to the jig along the first direction, and the support layer is totally attached to the flexible display panel.

In the apparatus shown in FIG. 24, the jig 21 may further be the other jig shown in FIG. 4.

Both the shapes of the flexible display panel and the support layer are rectangular, and the lengths and the widths of the flexible display panel and the support layer vary in different products illustratively, the length of the flexible display panel may be 150 mm. The middle of the support layer is first attached to the flexible display panel, then an attached area between the support layer and the flexible display panel is gradually increased by rolling the roller back and forth, and two ends of the support layer are attached to the flexible display panel. Finally, the support layer is totally attached to the flexible display panel. In this way, the support layer and the flexible display panel may be attached more closely.

The method for attaching the flexible display panel to the jig may be the same as the method for attaching the support layer to the flexible display panel.

Described above are merely optional embodiments of the present disclosure, and are not intended to limit the present disclosure. Any modifications, equivalent substitutions, improvements, and the like within the spirit and principles of the present disclosure shall fall within the protection scope of the present disclosure.

What is claimed is:

1. An apparatus for fabricating a flexible display screen, comprising a roller mechanism and a jig, wherein the jig comprises a bearing surface configured to bear a flexible display panel, the bearing surface being a curved surface; and the roller mechanism comprises a roller, an axis of the roller being parallel to an element line of the bearing surface, and the roller being configured to roll on the bearing surface along a directrix of the bearing surface,
wherein the bearing surface comprises a flexible-circuit-board positioning groove; wherein the flexible-circuit-board positioning groove is disposed on an end of the bearing surface along a direction of the directrix, and along a direction of the element line of the bearing surface, a width of the flexible-circuit-board positioning groove is less than a length of the roller, such that the roller is prevented from entering the flexible-circuit-board positioning groove.

2. The apparatus according to claim 1, wherein an orthographic projection of the bearing surface on a plane perpendicular to the axis of the roller is a curve; wherein the curve is an arc curve; or the curve comprises a circular arc segment, a first linear segment, and a second linear segment, one end of the first linear segment being connected to and tangential to one end of the circular arc segment, and one end of the second linear segment being connected to and tangential to the other end of the circular arc segment.

3. The apparatus according to claim 2, wherein angles corresponding to the arc curve and the circular arc segment are not greater than 180°.

4. The apparatus according to claim 1, wherein the flexible display panel comprises a panel body and a flexible circuit board; and the jig comprises a vacuum adsorption structure; wherein the vacuum adsorption structure comprises a plurality of panel adsorption holes and a plurality of flexible-circuit-board adsorption holes.

5. The apparatus according to claim 1, wherein the roller mechanism further comprises a mounting frame and a pressing rod; wherein the mounting frame is disposed above the jig, the pressing rod is disposed on the mounting frame, and the roller is rotatably disposed on an end of the pressing rod.

6. The apparatus according to claim 1, wherein the roller mechanism comprises two rollers, and the roller mechanism further comprises a mounting frame and two support rods; wherein the mounting frame is disposed above the jig, one end of each of the two support rods is articulated on the mounting frame, and the other end of each of the two support rods is disposed with one rotatable roller; and articulated axes of the two support rods and the axes of the two rollers are parallel to each other.

7. The apparatus according to claim 6, wherein the two support rods are connected by an elastic restoring member, wherein the elastic restoring member is configured to supply a force to cause the two support rods to move towards each other.

8. The apparatus according to claim 5, wherein the roller mechanism further comprises an adsorption plate; wherein the adsorption plate is disposed above the jig, the adsorption plate comprises a roller clearance hole and a plurality of vacuum adsorption holes, the roller clearance hole being strip-shaped, and the plurality of the vacuum adsorption holes being disposed on two sides of the roller clearance hole.

9. The apparatus according to claim 1, wherein the bearing surface is a curved surface; and the roller mechanism further comprises a pair of connection arms, wherein one end of each of the pair of connection arms is articulated with the jig, articulated axes of the pair of connection arms are parallel to the element line y of the bearing surface, and the roller is rotatably disposed between the pair of connection arms.

10. The apparatus according to claim 9, wherein the roller is disposed on the connection arms in such a fashion that the roller is movable along length directions of the connection arm; and the connection arm possesses a compression mechanism, wherein the compression mechanism is configured to supply a force to cause the roller to move towards the bearing surface.

11. The apparatus according to claim 10, wherein the connection arm comprises an insertion hole and an axial through hole extending along the length direction of the connection arm; wherein the insertion hole is disposed on a side wall of the connection arm and is connected to the axial through hole; one end of the roller is inserted into the insertion hole, and the compression mechanism comprises a spring and an adjusting bolt, wherein one end of the adjusting bolt is disposed in the axial through hole, the spring is coaxially disposed in the axial through hole, and two ends of the spring are in contact with the adjusting bolt and the roller respectively.

12. The apparatus according to claim 1, further comprising a flattening jig, wherein the flattening jig comprises a carrier, a first positioning stopper, and a second positioning stopper; wherein the carrier comprises a flexible-display-panel drop zone and a positioning-stopper drop zone disposed on a side of the flexible-display-panel drop zone;
both the first positioning stopper and the second positioning stopper are rotatably connected to the carrier; and the first positioning stopper is configured to provide a positioning surface configured to position the flexible display panel in the case that the first positioning stopper is disposed in the positioning-stopper drop zone, and an orthographic projection of the positioning surface on the positioning-stopper drop zone covers a first boundary; and
the second positioning stopper is configured such that, in the case that the second positioning stopper is disposed in the positioning-stopper drop zone, an orthographic projection of a surface, proximal to the flexible-display-panel drop zone, of the second positioning stopper on the positioning-stopper drop zone covers a second boundary, wherein the second boundary is spaced apart from the first boundary, and the first boundary is disposed between the second boundary and the flexible-display-panel drop zone.

13. The apparatus according to claim 1, further comprising a panel bracket, wherein the panel bracket comprises a horizontal support surface and a curved support surface; wherein a curved surface where the curved support surface is disposed is tangential to the horizontal support surface; and the horizontal support surface comprises a stop protrusion.

14. A method for fabricating a flexible display screen applicable to the apparatus as defined in claim 1, the method comprising:

attaching the flexible display panel to the bearing surface of the jig; and
placing a support layer between the roller and the bearing surface, and rolling the roller along the bearing surface to attach the support layer to the flexible display panel.

15. The method according to claim 14, wherein rolling the roller along the bearing surface comprises:
attaching a middle of the support layer to the flexible display panel;
rolling the roller along a first direction relative to the jig, and attaching a part of one end of the support layer to the flexible display panel;
rolling the roller along a second direction relative to the jig, and attaching the other end of the support layer to the flexible display panel, wherein the second direction is opposite to the first direction; and
moving the roller along the first direction relative to the jig, and attaching the whole support layer to the flexible display panel.

16. The apparatus according to claim 6, wherein the roller mechanism further comprises an adsorption plate; wherein the adsorption plate is disposed above the jig, the adsorption plate comprises a roller clearance hole and a plurality of vacuum adsorption holes, the roller clearance hole being strip-shaped, and the plurality of the vacuum adsorption holes being disposed on two sides of the roller clearance hole.

17. The apparatus according to claim 7, wherein the roller mechanism further comprises an adsorption plate; wherein the adsorption plate is disposed above the jig, the adsorption plate comprises a roller clearance hole and a plurality of vacuum adsorption holes, the roller clearance hole being strip-shaped, and the plurality of the vacuum adsorption holes being disposed on two sides of the roller clearance hole.

18. The apparatus according to claim 1, wherein the flexible-circuit-board positioning groove comprises a bottom surface and two opposite side surfaces, wherein the bottom surface comprises a first side edge, a second side edge, and a third side edge, the first side edge is connected to the bearing surface, one end of the first side edge is connected to one end of the second side edge, the other end of the first side edge is connected to one end of the third side edge, one of the two side surfaces is connected to the second side edge, the other of the two side surfaces is connected to the third side edge, and both of the two side surfaces are connected to the bearing surface;
wherein an included angle formed between the bottom surface and a tangent plane of the bearing surface at the first side edge is an acute angle.

* * * * *